United States Patent [19]

Nishiyama

[11] Patent Number: 5,257,444
[45] Date of Patent: Nov. 2, 1993

[54] PLATE MAKING APPARATUS
[75] Inventor: Mikio Nishiyama, Kanagawa, Japan
[73] Assignee: Fuji Photo Film Co., Ltd., Kanagawa, Japan
[21] Appl. No.: 4,305
[22] Filed: Jan. 14, 1993
[30] Foreign Application Priority Data
  Mar. 9, 1992 [JP] Japan .................... 4-50915
[51] Int. Cl.⁵ .................... B23P 15/00; B23Q 7/06
[52] U.S. Cl. .................... 29/33 H; 29/33 P; 72/324
[58] Field of Search ............ 29/33 H, 33 P, 34 R, 29/564, 563, 895.21; 72/319, 320, 341, 324, 323; 101/DIG. 36

[56] References Cited
U.S. PATENT DOCUMENTS

| 3,735,627 | 5/1973 | Eburn, Jr. ............... | 72/324 |
| 4,594,868 | 6/1986 | Takeuchi et al. ........ | 72/323 |
| 5,205,039 | 4/1993 | Ternes ................... | 29/895.21 |

FOREIGN PATENT DOCUMENTS 59172 2/1990 Japan .................... 29/33 P

OTHER PUBLICATIONS

Japanese Publication No. 2-23861, "Manufacture of Lithographic Plate", Hiroichi Ozawa, Feb. 17, 1983.
Japanese Publication No. 2-19952, "Developing Device of Printing Original Sheet" Hiroichi Ozawa, May 14, 1983.

Primary Examiner—William Briggs
Attorney, Agent, or Firm—Sughrue, Mion, Zinn, Macpeak & Seas

[57] ABSTRACT

A plate making apparatus is provided with a processing section conveying an elongated, rectangular printing plate, on which an image has been exposed, along a longitudinal direction of the printing plate and effecting processing of the printing plate, and is provided with a punching section provided downstream of the processing section and conveying the printing plate, which has been processed, along a transverse direction of the printing plate and forming punch holes in both longitudinal direction end portions of the printing plate. A plate bending section is provided downstream of the punching section, conveys the printing plate, in which punch holes have been formed, along the transverse direction of the printing plate and effects bending of both longitudinal direction end portions of the printing plate. A direction changing section is provided between the processing section and the punching section, changes a conveying direction of the printing plate from the longitudinal direction of the printing plate to the transverse direction of the printing plate, and moves the printing plate to the punching section.

20 Claims, 9 Drawing Sheets

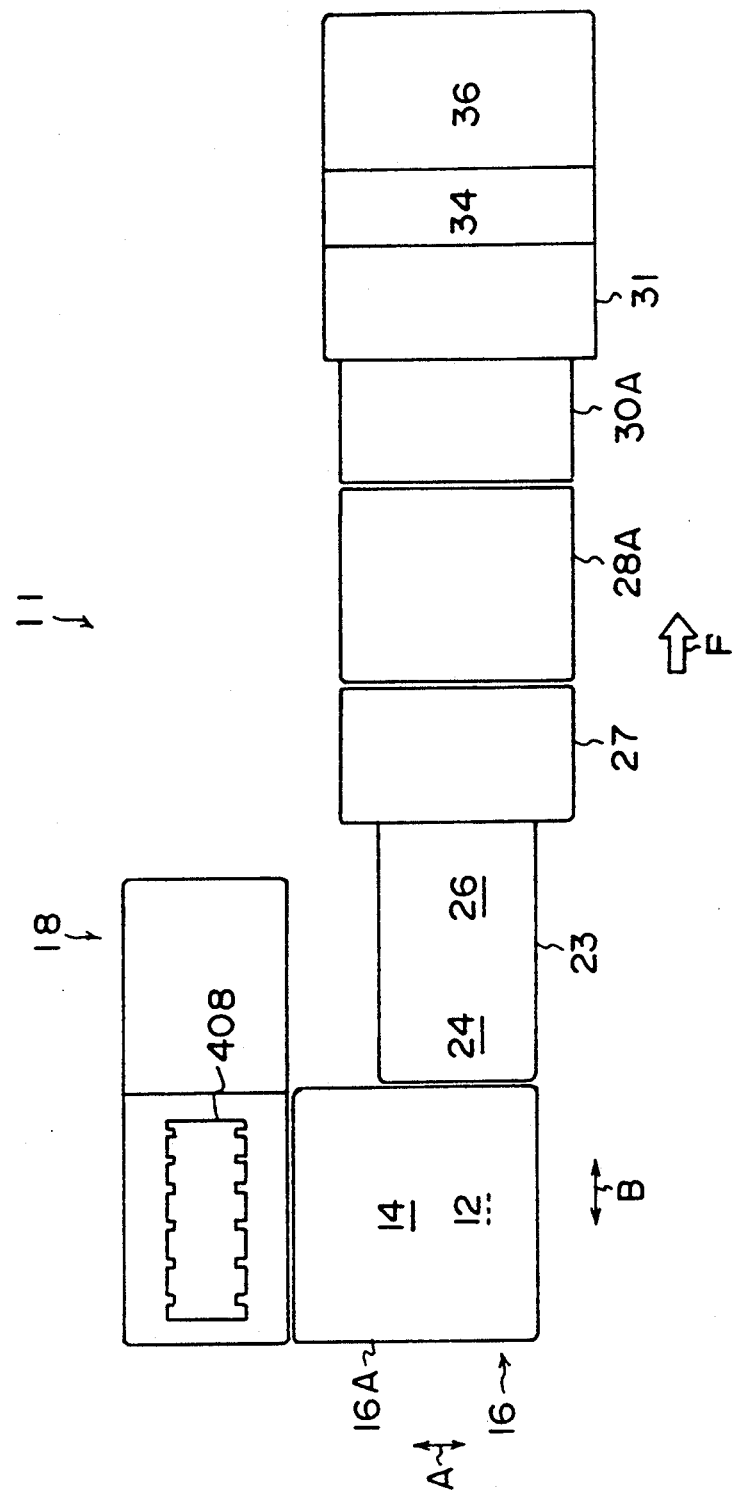

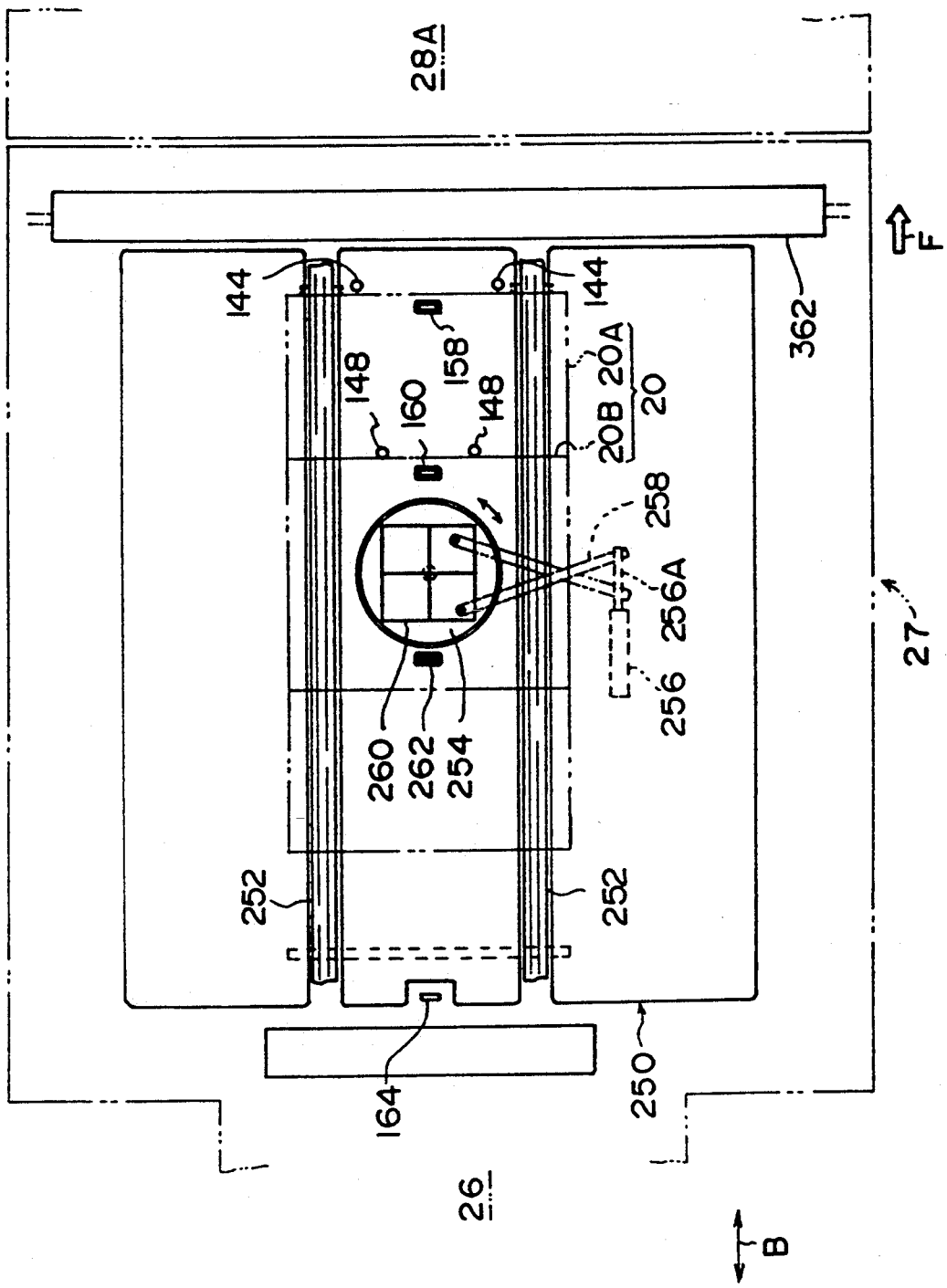

PLATE MAKING APPARATUS

BACKGROUND OF THE INVENTION

1. Field of the Invention

The present invention relates to a plate making apparatus in which printing plates, on which images have been recorded by an image recording apparatus, are successively processed, punched, and subjected to plate bending.

2. Description of the Related Art

Photosensitive lithographic printing plates (hereinafter, "printing plates") used in an offset rotary press for newspapers include an OPC (organic photoconductor) photosensitive material which is formed by an organic photosemiconductor being applied to a conductive supporting body such as aluminum or the like so as to form a photoconductive photosensitive layer. There is a direct reproduction recording system which manufactures plates from this type of printing plate. In this type of a direct reproduction recording system, an image is directly recorded on the image recording surface (photosensitive surface) of the printing plate by the printing plate being charged and exposed. Generally, a printing plate of a size of two newspaper pages (approximately 1100 mm long by 400 mm wide) is used for a printing plate for printing a newspaper.

In the above-described direct reproduction recording system, the printing plate, on which an electrostatic latent image has been formed by the printing plate being charged and exposed, is subject to developing processing and fixing processing in which toner adheres and fixes to the printing plate in accordance with the image. In the developing process of the printing plate, toner is made to adhere evenly to the image recording surface of the printing plate. Thereafter, a toner image corresponding to the exposed image is formed by the toner remaining only on the image area portions of the printing plate. In the fixing process of the printing plate, the toner is heated by a fixing lamp, is filmized, and is fixed to the image recording surface. After the printing plate has been subjected to developing and fixing processing, portions of the photosensitive layer other than the image areas are eluted, and the printing plate is dried. The dried printing plate is conveyed to a punching section and a plate bending section where holes are punched in both longitudinal ends of the printing plate and both longitudinal ends are bent so that the printing plate may be loaded at the cylinder of a rotary press.

In the aforementioned system, an apparatus in which the printing plate is conveyed such that the shorter side thereof runs along the conveying direction is advantageous in terms of the processing time and the amount of space occupied. However, when the printing plate is subject to developing processing, the toner must adhere evenly to the image recording area of the printing plate. As a result, when the printing plate is conveyed along the transverse direction (widthwise direction) thereof, the toner must be applied evenly to the wide range of the length (approximately 1100 mm) of the printing plate. The devices for developing/fixing processing are therefore expensive. As a result, in the developing/fixing section, the printing plate is conveyed along the longitudinal direction thereof.

However, when the printing plate is conveyed longitudinally so that the functions of the developing/fixing section can be effectively exhibited, the devices which punch holes in both longitudinal ends of the printing plate in the punching section and which bend both longitudinal ends of the printing plate in the plate bending section interfere with the conveying path of the printing plate.

SUMMARY OF THE INVENTION

With the aforementioned in view, an object of the present invention is to provide a plate making apparatus having a conveying path which enables a developing/fixing section, a punching section and a plate bending section to function effectively and printing plates to be processed.

A plate making apparatus relating to a first aspect of the present invention includes a processing section conveying an elongated, rectangular printing plate, on which an image has been exposed, along a longitudinal direction of the printing plate and effecting processing of the printing plate; a punching section provided downstream of the processing section and conveying the printing plate, which has been processed, along a transverse direction of the printing plate and forming punch holes in both longitudinal direction end portions of the printing plate; a plate bending section provided downstream of the punching section and conveying the printing plate, in which punch holes have been formed, along the transverse direction of the printing plate and effecting bending of both longitudinal direction end portions of the printing plate; and a direction changing section provided between the processing section and the punching section, and changing a conveying direction of the printing plate from the longitudinal direction of the printing plate to the transverse direction of the printing plate, and moving the printing plate to the punching section.

According to the first aspect of the present invention having the above structure, the direction changing section is disposed between the processing section and the punching section. In the direction changing section, the conveying direction of the printing plate, which is conveyed from the processing section along the longitudinal direction of the printing plate, is changed so that the printing plate is conveyed along the transverse direction thereof and is sent downstream of the processing section. In this way, the printing plate is processed in the processing section while being conveyed along the longitudinal direction of the printing plate. Further, in the punching section and the plate bending section, processing can be effected while the printing plate is conveyed along the transverse direction thereof. Therefore, there is no interference between the printing plate being conveyed in the punching section and the plate bending section and the devices used for punching and plate bending. Further, in accordance with the present aspect, the conveying path of the printing plate, which is being conveyed along the longitudinal direction thereof, can easily be changed 90 degrees in the direction changing section, thereby allowing each section in the plate making apparatus to function effectively.

A plate making apparatus relating to a second aspect of the present invention includes a processing section conveying an elongated, rectangular printing plate, on which an image has been exposed, and effecting processing of the printing plate; a punching section provided downstream of the processing section and conveying the printing plate, which has been processed, along a transverse direction of the printing plate and forming punch holes in both longitudinal direction end portions of the printing plate; a plate bending section provided downstream of the punching section and conveying the printing plate, in which punch holes have been formed, along the transverse direction of the printing plate and effecting bending of both longitudinal direction end portions of the printing plate; and a direction changing section provided in the processing section and changing a conveying direction of the printing plate from a longitudinal direction of the printing plate to the transverse direction of the printing plate.

According to the second embodiment of the present invention structured as described above, the direction changing section is provided in the processing section. The printing plate is inserted into the processing section along the longitudinal direction of the printing plate. In the processing section, the conveying direction of the printing plate is charged. The printing plate is discharged from the processing section while being conveyed along the transverse direction of the printing plate, and is sent to the punching section and the plate bending section.

For example, with a printing plate using an OPC photosensitive material, after developing and fixing processing have been effected in the processing section, the operations involved in eluting processing and drying processing are effected in a series. When the direction changing section is disposed at a position at which the processing section is connected to the punching section and the plate bending section, the assembly of the devices and the positioning of the conveying path are facilitated. Further, the direction changing section can be provided in the processing section so that the printing plate is conveyed along the longitudinal direction thereof in the sections in which developing and fixing are effected and so that the printing plate is conveyed along the transverse direction thereof from the eluting section to the drying processing section.

As described above, in the plate making apparatus of the present invention, by providing the direction changing section between the processing section and the punching section or in the processing section, the conveying path of the printing plate can be formed so as to be structurally advantageous to each section. In addition, a superior effect is achieved in that the conveying path of the printing plate from the developing/fixing section through the punching and plate bending sections is linear and simple.

BRIEF DESCRIPTION OF THE DRAWINGS

FIG. 8 is a schematic plan view illustrating a structure of a direct plate making apparatus relating to a second embodiment.

FIG. 9 is a plan view illustrating a cooling section relating to the second embodiment.

DESCRIPTION OF THE PREFERRED EMBODIMENTS

A summary of a direct plate making apparatus 10 relating to an embodiment of the present invention will be described with reference to FIGS. 1 through 3.

A printing plate 20 used in the present embodiment is a rectangular OPC direct printing plate which is formed of an aluminum plate approximately 0.3 mm thick which serves as a conductive supporting body, an anodic oxidized layer which makes one of the surfaces of the aluminum plate an image recording surface (photosensitive surface), and a several micron thick OPC layer which is coated on the top surface of the anodic oxidized layer and whose main component is an OPC alkali soluble polymer. Further, the dimensions of the conductive supporting body, i.e., the dimensions of the printing plate 20, are 398 mm by 1120 mm (the size of two pages of newspaper). A printing plate of this size is referred to hereinafter as "printing plate 20A". Alternatively, the dimensions of the printing plate 20 may be, for example, 398 mm by 560 mm (the size of one newspaper page). A printing plate of this size is designated hereinafter as "printing plate 20B". (The term "printing plate 20" includes both printing plate 20A and printing plate 20B). Other dimensions are also applicable for the printing plate 20 which is subject to processing at the direct plate making apparatus 10.

In each of the figures, the direction of arrow A corresponds to the transverse direction of the printing plate 20. The direction of arrow B corresponds to the longitudinal direction of the printing plate 20. In the direct plate making apparatus 10 relating to the present embodiment, when the printing plate 20 is conveyed to an adjacent processing section, the printing plate 20 is moved parallel along the transverse direction or the longitudinal direction thereof.

Figure 1:
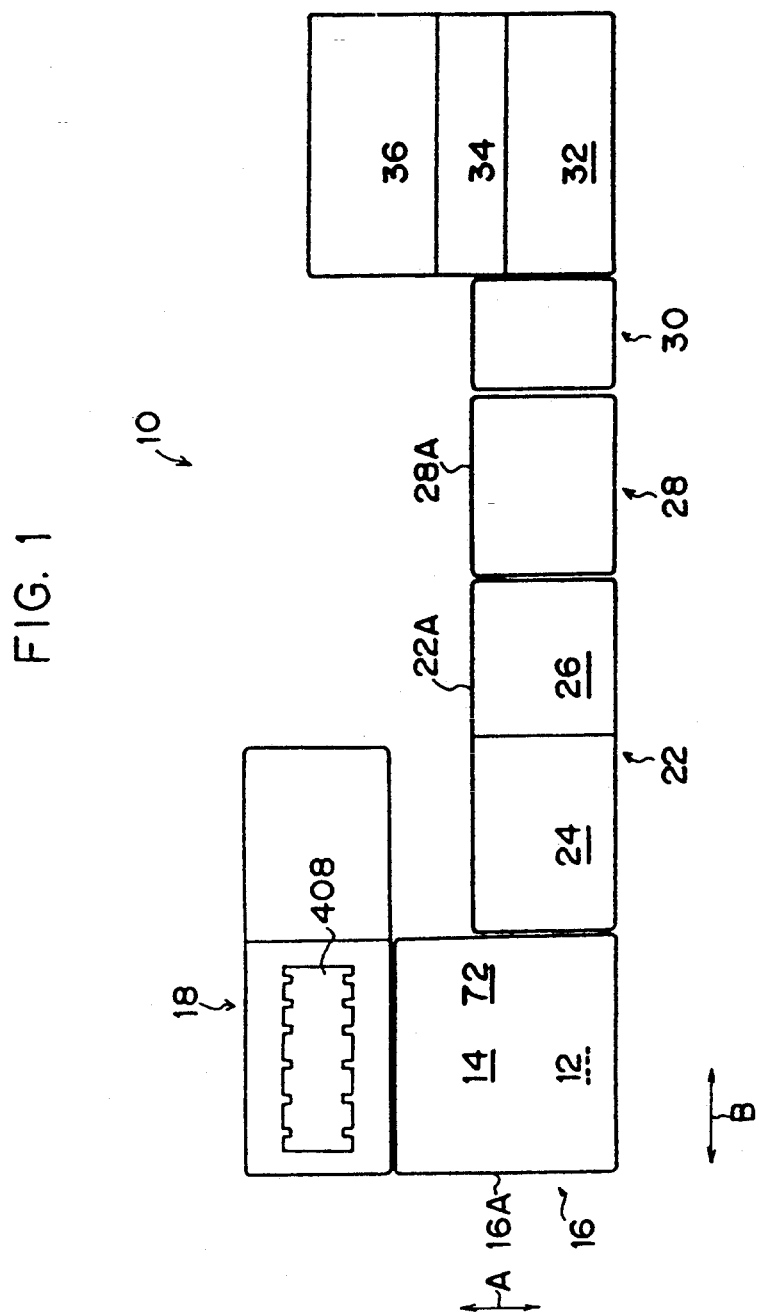
FIG. 1 is a schematic plan view illustrating a structure of a direct plate making apparatus relating to a first embodiment.
Figure 2:
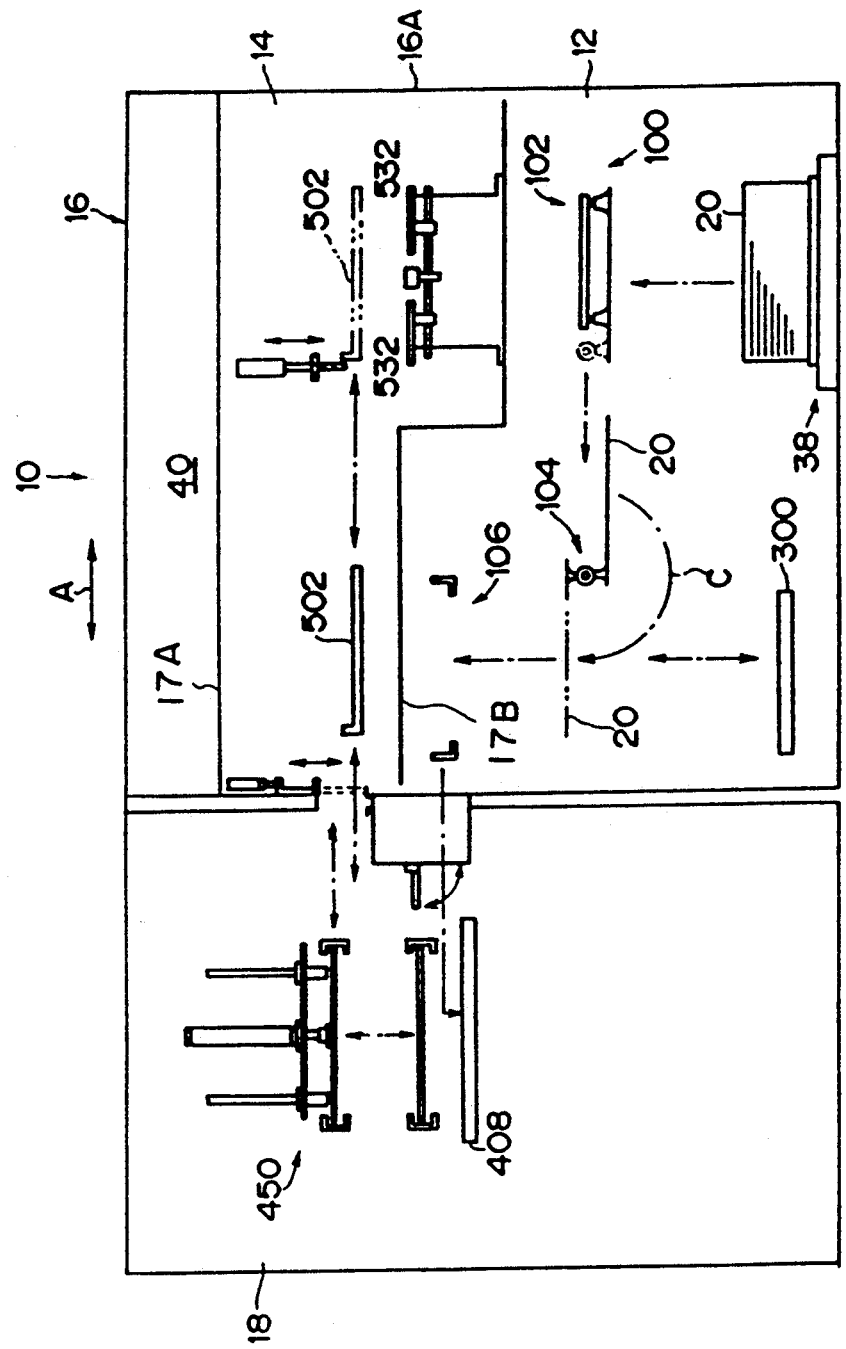
FIG. 2 is a schematic side view illustrating a structure of a portion of the direct plate making apparatus relating to the present embodiment.
Figure 3:
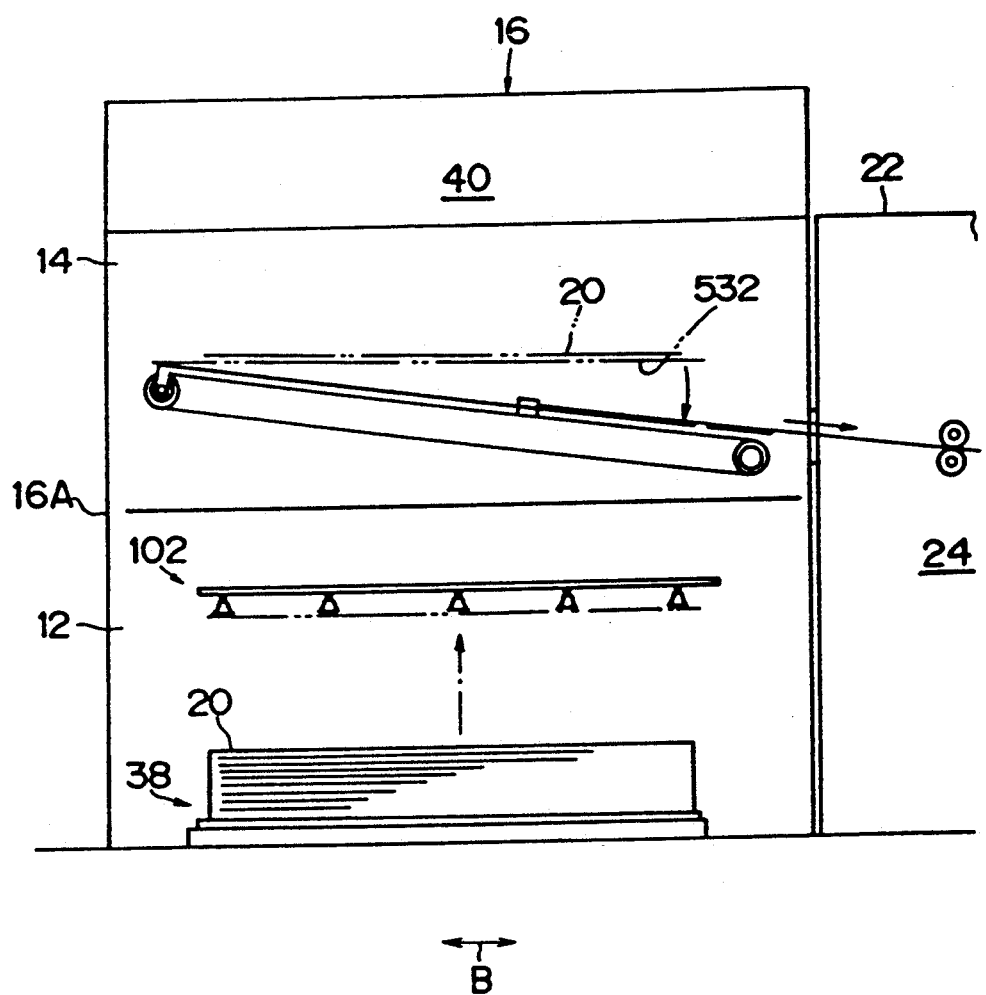
FIG. 3 is a schematic front view illustrating a structure of a portion of the direct plate making apparatus relating to the present embodiment.

As shown in FIGS. 1 through 3, the direct plate making apparatus 10 is provided with a plate supplying-/discharging section 16 formed of a plate supplying section 12, which supplies the printing plates 20 to a drawing section 18, and a plate discharging section 14 which discharges the printing plates 20 from the drawing section 18. These sections are respectively defined by separating walls 17A, 17B. Further, a control section 40 which controls the operations of the plate supplying section 12 and the plate discharging section 14 is located in an upper portion of the plate supplying/discharging section 16.

A printing plate holding stand 38, on which the printing plates 20 are stacked, is loaded at the plate supplying section 12. The printing plates 20 are stacked and loaded on the printing plate holding stand 38 so as to be substantially parallel to the floor. The printing plates 20 are stacked so that the respective image recording surfaces thereof face toward the bottom of the direct plate making apparatus 10. The printing plates 20 are positioned with respect to the plate supplying section 12 by loading the printing plate holding stand 38 at a predetermined position in the plate supplying section 12.

The printing plate holding stand 38 is loaded into and removed from the plate supplying section 12 through an unillustrated shutter provided on a casing 16A. The shutter is usually closed so that the interior of the plate supplying section 12 is shaded. The printing plate holding stand 38 may be moved by an unillustrated forklift or the like. Alternatively, the printing plate holding stand 38 may be made movable by casters or the like provided on the bottom surface thereof.

A sucking/raising device 102 and a reversing device 104 are provided in the plate supplying section 12. The respective upper surfaces of the printing plates 20 loaded on the printing plate holding stand 38 are sucked and held by the sucking/raising device 102 so that the printing plates 20 are raised and transferred to the reversing device 104. The reversing device 104 sucks and holds one transverse direction end portion of the printing plate 20, and rotates the printing plate 20 (in the direction of arrow C in FIG. 2). In this way, the printing plate 20 is reversed such that the image recording surface thereof faces toward the top of the direct plate making apparatus 10.

A lift stand 300 and a horizontally conveying device 106 are provided in the plate supplying section 12. The printing plate 20 reversed by the reversing device 104 is loaded on the lift stand 300. After the printing plate 20 loaded on the lift stand 300 is positioned with respect to the lift stand 300, the printing plate 20 is transferred to the horizontally conveying device 106. The bottom surface of the printing plate 20 is supported by a plurality of claw portions of the horizontally conveying device 106. The printing plate 20 is conveyed onto a surface plate 408 of the drawing section 18 which is provided adjacent to the plate supplying section 12.

After the printing plate 20 loaded on the surface plate 408 of the drawing section 18 has been charged, an electrostatic latent image is formed on the image recording surface of the printing plate 20 by an unillustrated drawing device. The printing plate 20, on which the electrostatic latent image has been formed, is moved by a removing device 450, which is positioned above the surface plate 408, toward the plate discharging section 14 which is adjacent to the drawing section 18 and above the plate supplying section 12. A conveying stage 502, which can move into the drawing section 18, is provided in the plate discharging section 14. The printing plate 20 raised and held by the removing device 450 is loaded onto the conveying stage 502.

The conveying stage 502 on which the printing plate 20 is loaded is moved toward insertion stages 532 provided in the plate discharging section 14 and adjacent to a developing/fixing section 22. Due to this movement of the conveying stage 502, the printing plate 20 is transferred from the moving stage 502 onto the insertion stages 532. As illustrated in FIG. 3, when the printing plate 20 is loaded on the insertion stages 532, the insertion stages 532 are inclined at a predetermined angle toward the developing/fixing section 22 located downstream of the plate supplying/discharging section 16. Thereafter, the printing plate 20 loaded on the insertion stages 532 is sent towards the developing/fixing section 22. The angle of inclination of the insertion stages 532 is equal to an angle of inclination at which the printing plate 20 is conveyed in a vicinity of an insertion opening provided at the developing/fixing section 22.

As illustrated in FIG. 1, the developing/fixing section 22, an eluting section 28, a drying section 30 and a standby section 32 are disposed downstream of the plate supplying/discharging section 16 successively along the longitudinal direction (the direction of arrow B) of the printing plate 20. The printing plate 20 is conveyed along the longitudinal direction thereof (the printing plate 20 is conveyed in the direction of arrow B).

The developing/fixing section 22 is formed by a developing processing section 24, in which the printing plate 20 on which the electrostatic latent image has been formed undergoes developing processing, and a fixing processing section 26, in which the developed printing plate 20 undergoes fixing processing. After a toner which is a developing solution is applied to the printing plate 20 in the developing processing section 24, the unnecessary toner is squeezed from the printing plate 20 which is then dried. A reversal developing method is used as the developing method in the developing processing section 24. In the reversal developing method, a toner having plus charges is applied to the surface of the printing plate 20 which has been charged plus in the drawing section 18. Further, the developing processing section 24 is structured such that the printing plate 20 is inclined at a predetermined angle and is transported along the longitudinal direction thereof so that the toner particles flow evenly over the surface of the printing plate 20 when applied thereto.

In the fixing processing section 26 of the developing/fixing section 22, the printing plate 20 is cooled after being heated by a fixing lamp. The toner particles heated by the fixing lamp filmize and are fixed to the surface of the printing plate 20.

The eluting section 28 is disposed downstream of the developing/fixing section 22. In the eluting section 28, the printing plate 20 is submerged in alkali solution, and etching processing is effected. The OPC layer is alkali soluble. When the printing plate 20 is submerged in the alkali solution, the portions of the OPC layer to which the toner does not adhere (i.e., the non-image areas) are eluted, and only the toner image portions of the OPC layer remain on the printing plate 20. After the printing plate 20 which has undergone etching processing is washed, gum solution is applied evenly to the printing plate 20 so as to protect the surface thereof.

After the printing plate 20 has undergone etching processing and the surface thereof has been protected, the printing plate 20 is sent into the drying section 30. In the drying section 30, warm air is blown to the surface of the printing plate 20 so that the gum solution adhering thereto is dried.

The standby section 32 is disposed downstream of the drying section 30. In the standby section 32, one transverse direction end of the printing plate 20 (i.e., one end in the direction of arrow A) is adjacent to the punching section 34. The plate bending section 36 is disposed along the transverse direction of the printing plate 20 and is adjacent to the punching section 34 at the side opposite to the standby section 32. When the printing plate 20 is conveyed to the punching section 34 and the plate bending section 36 from the standby section 32, the conveying direction of the printing plate 20 is changed in the standby section 32 so that the printing plate 20 is conveyed along the transverse direction thereof (the printing plate 20 is conveyed in the direction of arrow A).

Figure 4:
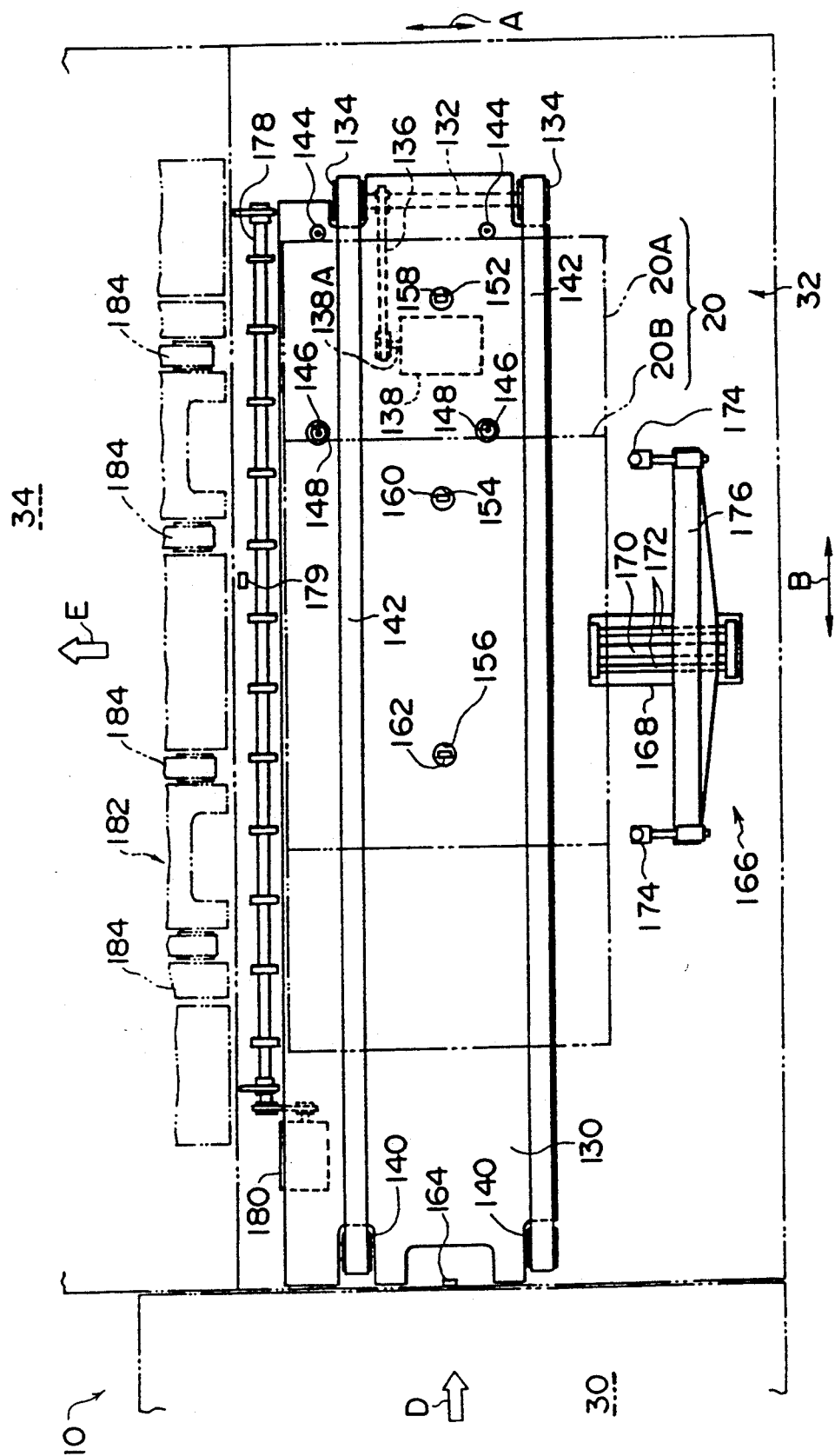
FIG. 4 is a plan view illustrating a standby section relating to the first embodiment.

As illustrated in FIG. 4, a standby plate 130 is disposed within the standby section 32 such that the longitudinal direction of the standby plate 130 runs along the longitudinal direction of the printing plate 20. Under a vicinity of the longitudinal end portion of the standby plate 130 at the side opposite the drying section 30, a shaft 132 is disposed along the transverse direction of the standby plate 130 so as to be rotatable. Pulleys 134 are attached respectively to end portions of the shaft 132. The driving force from a rotating shaft 138A of a motor 138 disposed beneath the standby plate 130 is transmitted via an endless belt 136 to an intermediate portion of the shaft 132.

Figure 5:
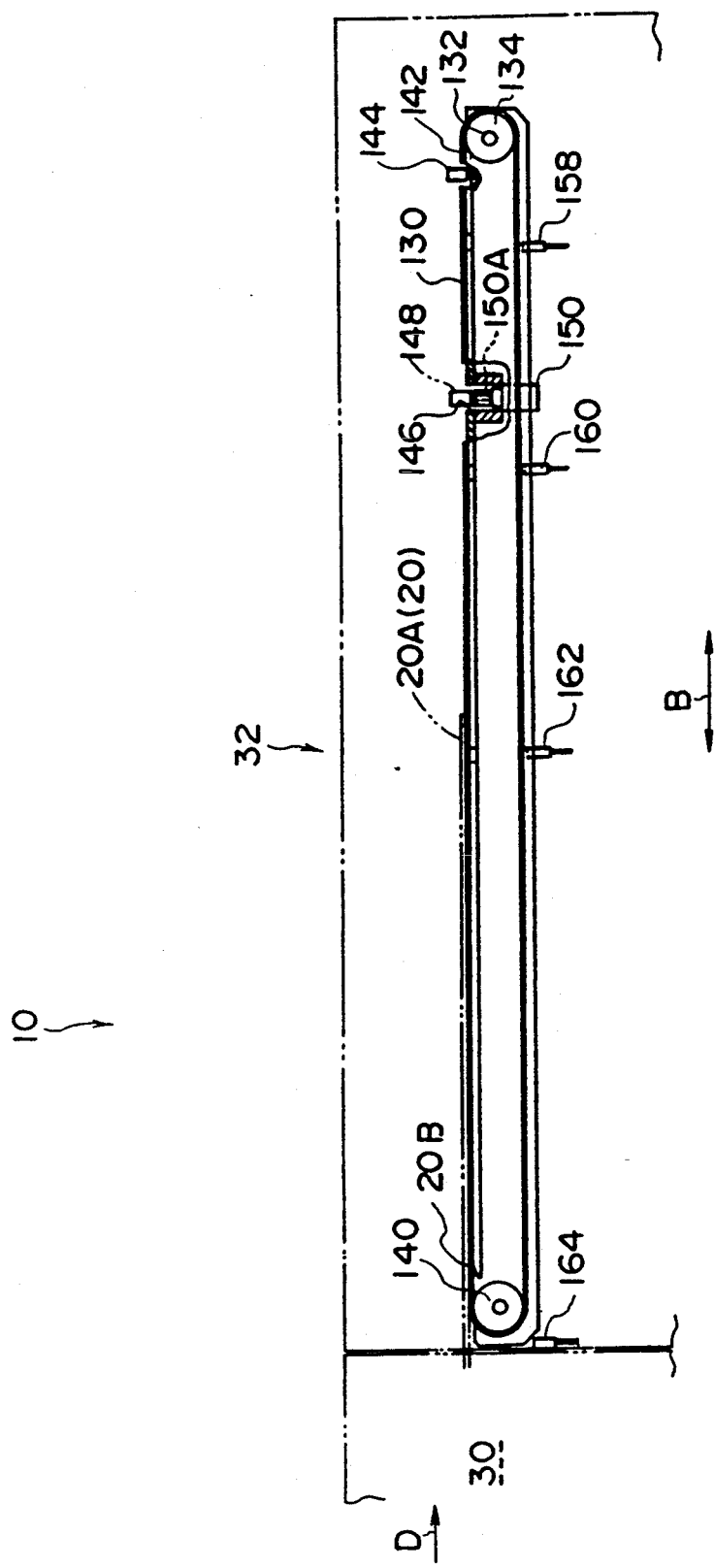
FIG. 5 is a front view of main portions of the standby section relating to the first embodiment.

Pulleys 140, which correspond respectively to the pulleys 134, are disposed so as to be rotatable at a vicinity of a longitudinal direction end portion of the standby plate 130 at the drying section 30 side. Portions of the outer circumferences of the pulleys 134, 140 are disposed in vicinities of the upper surface of the standby plate 130. Conveying belts 142 which are endless belts are trained around the pulleys 134, 140. As illustrated in FIG. 5, the portion of the conveying belt 142 located above the top surface of the standby plate 130 moves from the drying section 30 along the top surface and along the longitudinal direction of the standby plate 130. The portion of the conveying belt 142 located beneath the standby plate 130 moves beneath the standby plate 130 in the opposite direction. The printing plate 20 sent from the drying section 30 is conveyed along the top surface of the standby plate 130 by the movement of the conveying belts 142.

As illustrated in FIG. 4, positioning rollers 144 are disposed in a vicinity of the end portion, which is opposite to the drying section 30, of the standby plate 130. The positioning rollers 144 are disposed in vicinities of both sides of the standby plate 130 along the transverse direction thereof in vicinities of the pulleys 134. Respective rotating shafts of the positioning rollers 144 face upward. When the printing plate 20A is sent in from the drying section 30, the front end of the printing plate 20A abuts the positioning rollers 144 so that the printing plate 20A is stopped.

A pair of through-holes 146 are formed in the standby plate 130 at positions further toward the drying section 30 side than the positions of the positioning rollers 144. The through-holes 146 are formed along the transverse direction of the standby plate 130 at vicinities of both end portions thereof. A positioning roller 148 is disposed respectively in each of the through-holes 146 so as to be able to rise above and sink beneath the top surface of the standby plate 130. As illustrated in FIG. 5, the positioning roller 148 is disposed on a driving shaft 150A of an air cylinder 150 mounted to the bottom surface of the standby plate 130. The positioning roller 148 is projected above the standby plate 130 from the through-hole 146 by the driving of the air cylinder 150. The positioning rollers 148 are projected above the standby plate 130 when the printing plate 20B is sent in from the drying section 30. The leading end of the printing plate 20B abuts the respective outer circumferential surfaces of the positioning rollers 148 so that the printing plate 20B is stopped.

The positioning rollers 144, 148 are disposed such that a longitudinal center line of the printing plate 20A stopped by the positioning rollers 144 substantially corresponds to a longitudinal center line of the printing plate 20B stopped by the positioning rollers 148.

As shown in FIG. 4, through-holes 152, 154, 156 are formed along the longitudinal direction of the standby plate 130 in an intermediate portion in the transverse direction thereof. The through-hole 152 is located further toward the drying section 30 than the positioning rollers 144. A plate detecting sensor 158 is disposed beneath the through-hole 152. The through-hole 154 is located further toward the drying section 30 than the positioning rollers 148. A plate detecting sensor 160 is disposed beneath the through-hole 154. The through-hole 156 is located further toward the drying section 30 than the through-hole 154. A plate detecting sensor 162 is disposed beneath the through hole 156. A plate detecting sensor 164 disposed at a vicinity of the drying section 30 corresponds to the plate detecting sensor 162.

The interval between the plate detecting sensor 162 and the plate detecting sensor 164 is longer than the longitudinal direction dimension of the printing plate 20B and is shorter than the longitudinal direction dimension of the printing plate 20A. Accordingly, when the printing plate 20 sent from the drying section 30 and conveyed onto the standby plate 130 is detected by the plate detecting sensor 162 and is also detected by the plate detecting sensor 164 disposed further toward the drying section 30 than the plate detecting sensor 162, the printing plate 20 is the printing plate 20A. When the printing plate 20 is detected by the plate detecting sensor 162 but is not detected by the plate detecting sensor 164, the printing plate 20 is the printing plate 20B.

When the printing plate 20A is detected by the plate detecting sensors 162, 164, the positioning rollers 148 are accommodated in the through-holes 146 due to the driving of the air cylinders 150 so that the printing plate 20A reaches the positioning rollers 144. The plate detecting sensor 158 detects the printing plate 20A, which has been stopped at the positioning rollers 144, and determines the timing for stopping the conveying belts 142. The plate detecting sensor 160 detects the printing plate 20B, which has been stopped at the positioning rollers 148, and determines the timing for stopping the conveying belts 142. The positions at which the printing plates 20A, 20B are stopped at the respective positioning rollers 144, 148 correspond to positions at which the printing plates 20A, 20B are positioned in the punching section 34.

As shown in FIG. 4, a pusher 166 is disposed at the transverse direction side of the standby plate 130 at the side opposite the punching section 34. In the pusher 166, a rodless cylinder 170 and guide rods 172 are disposed on a base 168 which is fixed to an unillustrated frame of the standby section 32. The direction of driving of the rodless cylinder 170 and the axial directions of the respective guide rods 172 run along the transverse direction of the standby plate 130. A bracket 176 having pushing rollers 174 is connected to the rodless cylinder 170 and the guide rods 172. The guide rods 172 are slidably inserted along the axial directions thereof through the bracket 176 and are connected to a driving portion of the rodless cylinder 170. As a result, the bracket 176 is moved along the transverse direction of the standby plate 130 due to the driving of the rodless cylinder 170.

Two pushing rollers 174 are mounted to the bracket 176 along the longitudinal direction of the standby plate 130. The outer circumferential surfaces of the pushing rollers 174 oppose a transverse direction end surface of the printing plate 20 stopped on the standby plate 130. As a result, due to the driving of the rodless cylinder 170, the pushing rollers 174 push the transverse direction end portion of the printing plate 20 towards the punching section 34 located downstream of the standby section 32.

The printing plate 20 pushed by the pusher 166 is moved by being slid on the standby plate 130 and the conveying belts 142. Therefore, by rotating the conveying belts 142 when the conveying belts 142 are contacting the bottom surface of the printing plate 20, the printing plate 20 can be conveyed. Further, even if the conveying belts 142 contact the printing plate 20, the printing plate 20 can be smoothly moved relative to the conveying belts 142 by being pushed. The material used for the conveying belts 142 produces an appropriate amount of friction between the conveying belts 142 and the supporting body of the printing plate 20. In the present embodiment, as an example, vinyl chloride having a static coefficient of friction of 0.3 with respect to polished steel is used as the material for the surfaces of the conveying belts 142 (trade name: sunline belt SL-8C FS).

A pair of skewer rollers 178 (only one is illustrated in FIG. 4) is rotatably disposed at the outer side of the transverse direction end of the standby plate 130 at the printing section 34 side. The pair of skewer rollers 178 is disposed along the vertical direction of the standby section 32. The skewer rollers 178 are disposed so that the axial directions thereof run along the longitudinal direction of the standby plate 130. The lower skewer roller 178 is rotated by the driving force from a motor 180 disposed under the standby plate 130 being transmitted to the skewer roller 178.

A transverse direction end portion of the printing plate 20 pushed by the pusher 166 is inserted between the skewer rollers 178. Due to the rotation of the skewer rollers 178, the printing plate 20 is interposed between the skewer rollers 178 and is delivered to the punching section 34. A plate detecting sensor 179 is disposed in a vicinity of the skewer rollers 178 and detects the printing plate 20 which is sent into the punching section 34 from the standby section 32.

Figure 6:
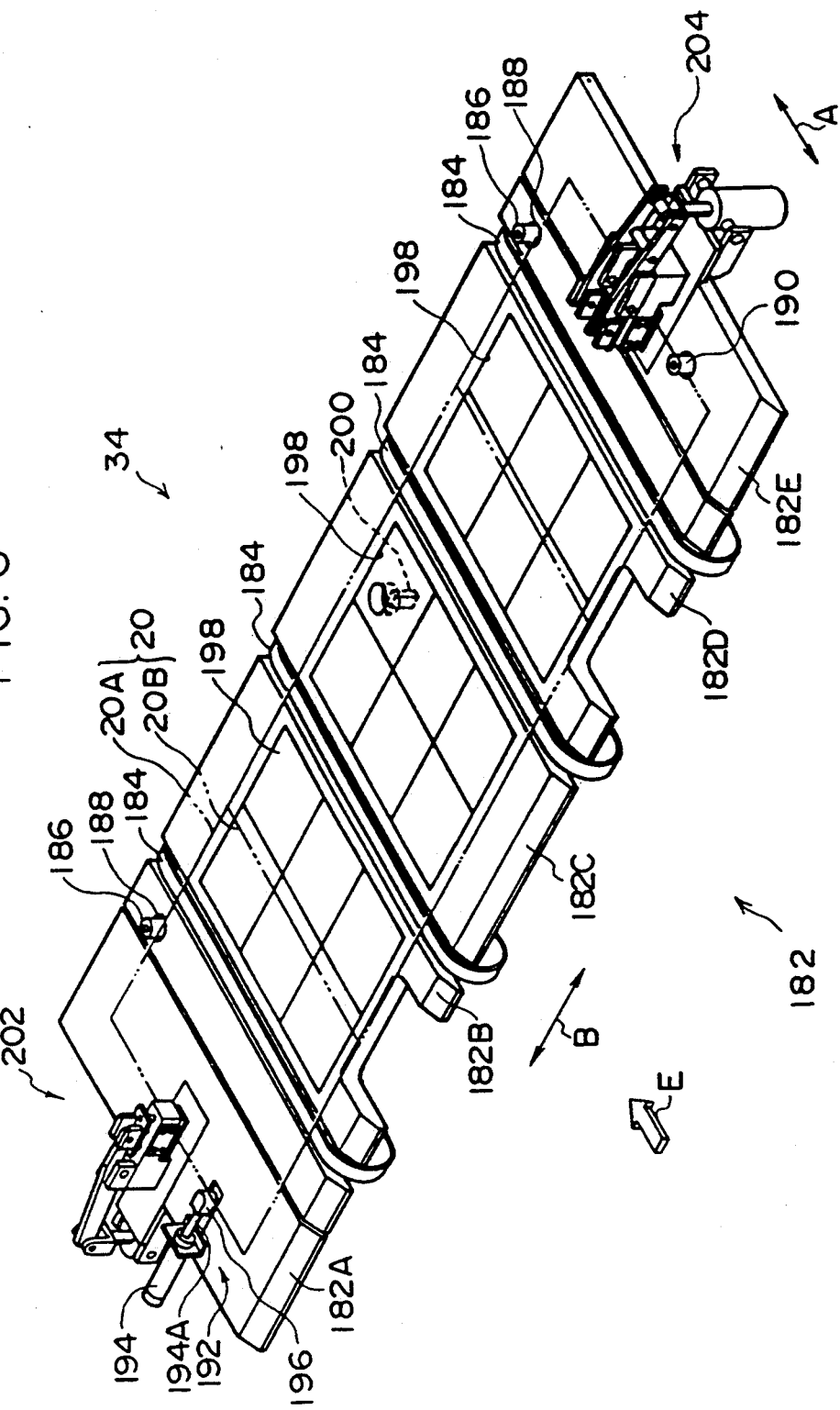
FIG. 6 is a perspective view of main portions illustrating a punching section relating to the present embodiment.

As illustrated in FIG. 6, a punching stand 182 is disposed in the punching section 34. The punching stand 182 is formed as an elongated, substantial rectangle by substantially rectangular base members 182A, 182B, 182C, 182D, 182E being connected along the longitudinal direction of the printing plate 20. One transverse direction end portion of the printing plate 20 delivered from the standby section 32 is set on the punching stand 182 first. Conveying belts 184, which are endless belts, are trained around the punching stand 182 in the transverse direction of the punching stand 182. A plurality of the conveying belts 184 is provided along the longitudinal direction of the punching stand 182. The conveying belts 184 are driven by driving force from an unillustrated driving means so as to rotate at a constant speed. Portions of the conveying belts 184 positioned at the upper surface side of the punching stand 182 move (in the direction of arrow E) from the standby section 32 side toward the plate bending section 36, which is located downstream of the punching section 34. The printing plate 20 sent from the standby section 32 is conveyed due to the movement of the conveying belts 184.

Positioning rollers 186 are provided at the transverse direction end portion of the punching stand 182 on the side opposite the standby section 32 and in vicinities of respective longitudinal end portions of the punching stand 182. The positioning rollers 186 can rise above or sink below the upper surface of the punching stand 182 from through-holes 188 formed in the punching stand 182. The positioning rollers 186 correspond respectively to both longitudinal direction end portions of the printing plate 20A. The interval between the positioning rollers 186 is longer than the longitudinal direction dimension of the printing plate 20B. When the positioning rollers 186 are projected, the printing plate 20A conveyed by the conveying belts 184 abuts the positioning rollers 186 and is stopped. Further, the printing plate 20B passes through the space between the positioning rollers 186.

A positioning roller 190 protrudes in a vicinity of one longitudinal direction end portion of the punching stand 182. A pusher 192, which corresponds to the positioning roller 190, is disposed at the other longitudinal direction end portion of the punching stand 182. The pusher 192 is equipped with an air cylinder 194 which protrudes a driving shaft 194A along the longitudinal direction of the punching stand 182 toward the positioning roller 190. A pushing block 196 is disposed at the end of the driving shaft 194A.

The printing plate 20A stopped on the punching stand 182 by the positioning rollers 186 is pushed by the pusher 192 toward the positioning roller 190 so that the printing plate 20A is positioned on the punching stand 182. A plurality of suction grooves 198 is provided in the upper surface of the punching stand 182. The suction grooves 198 are arranged so as to form substantially rectangular shapes on the upper surface of the punching stand 182. The printing plate 20A positioned on the punching stand 182 is sucked and held to the punching stand 182 by negative pressure supplied from an unillustrated negative pressure supplying means. A plate detecting sensor 200 which detects the printing plate 20A is disposed in a central portion of the punching stand 182. The plate detecting sensor 200 detects whether the printing plate 20A has been stopped on the punching stand 182 by the positioning rollers 186.

A puncher 202 is disposed at one end portion of the punching stand 182 in the longitudinal direction thereof, and a puncher 204 is disposed at the other longitudinal direction end portion. The punchers 202, 204 form punch holes in the longitudinal direction end portions of the printing plate 20A which is positioned and held on the punching stand 182. As an example, the puncher 202 may form notches, and the puncher 204 may form round holes as well as notches. The round holes and the notches are used for positioning when the printing plate 20A is loaded at a plate cylinder of a rotary press.

The holding of the printing plate 20A on the punching stand 182 is canceled by the positioning rollers 186 being accommodated within the through-holes 188 formed in the punching stand 182 and by the canceling of the supply of negative pressure to the suction grooves 198. The printing plate 20A is sent to the plate bending section 36, which is provided downstream of the punching section 34, by the movement of the conveying belts 184.

Figure 7:
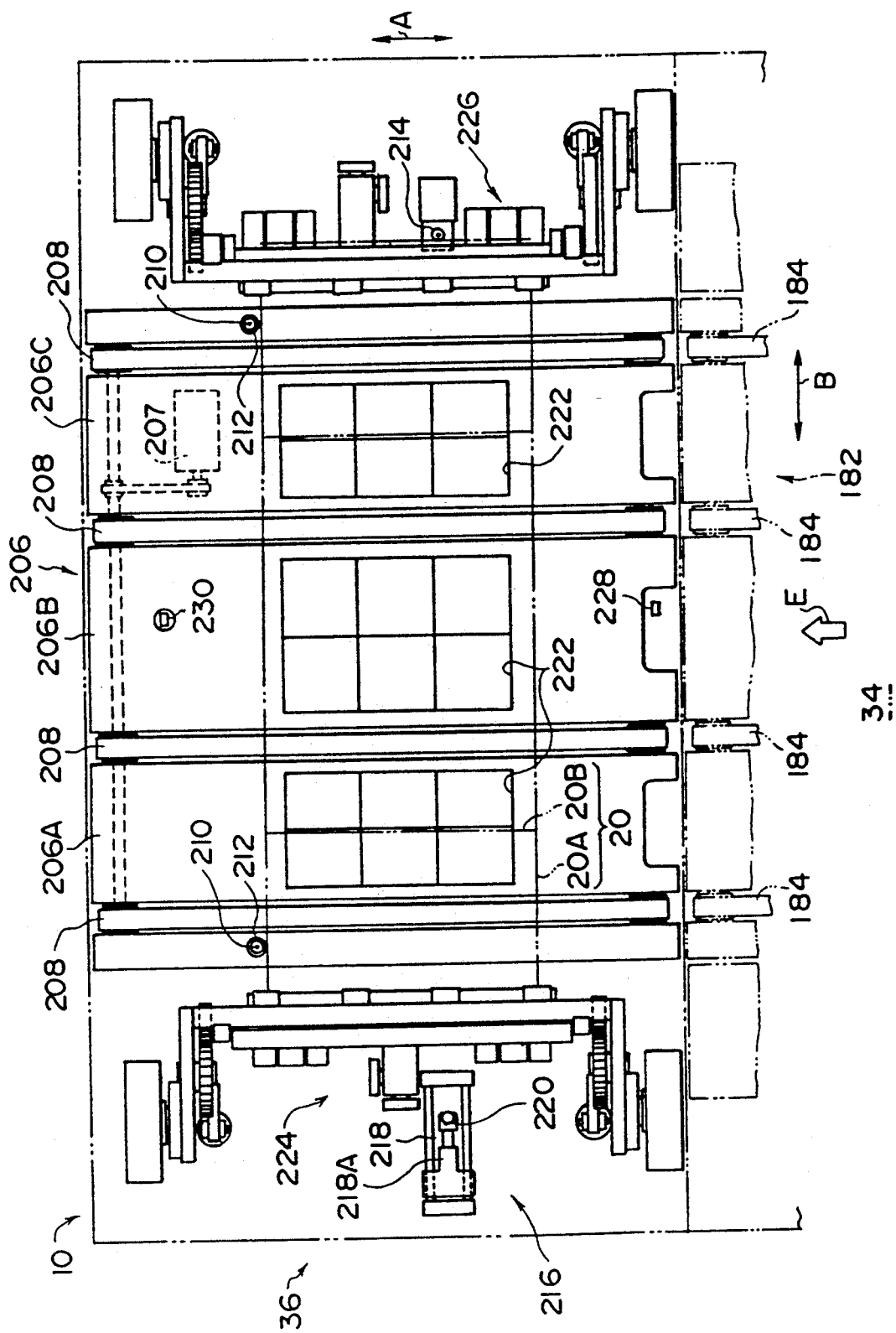
FIG. 7 is a plan view of main portions illustrating a plate bending section relating to the present embodiment.

As illustrated in FIG. 7, a plate bending stand 206 is formed as an elongated, substantial rectangle by substantially rectangular base members 206A, 206B, 206C being connected along the longitudinal direction of the printing plate 20. The printing plate 20 is delivered onto the plate bending stand 206 from one side end thereof. Conveying belts 208, which are endless belts, are trained around the plate bending stand 206 in the conveying direction of the printing plate 20 (the direction of arrow E in FIG. 7). A plurality of the conveying belts 208 is disposed along a direction orthogonal to the conveying direction of the printing plate 20 (in the present embodiment, there are four conveying belts 208). The conveying belts 208 are driven by driving force from a motor 207, which is disposed under the plate bending stand 206, so as to rotate at a constant speed. Portions of the conveying belts 208 positioned at the upper surface side of the plate bending stand 206 are moved in the conveying direction of the printing plate 20 so as to convey the printing plate 20 which has been sent in from the punching section 34.

Positioning rollers 210 are disposed on the plate bending stand 206 along the longitudinal direction of the printing plate 20 in a vicinity of the end portion opposite the punching section 34, and at vicinities of both end portions of the printing plate 20A in the longitudinal direction thereof. The positioning rollers 210 can rise above and sink below the upper surface of the plate bending stand 206 from through-holes 212. The interval between the positioning rollers 210 is longer than the longitudinal direction dimension of the printing plate 20B. As a result, when the printing plate 20 sent from the punching section 34 is the printing plate 20A, the printing plate 20A is stopped by the positioning rollers 210. On the other hand, when the printing plate 20 sent from the punching section 34 is the printing plate 20B, the printing plate 20B passes through the space between the positioning rollers 210.

A positioning roller 214 is provided on the plate bending stand 206 at one longitudinal end of the printing plate 20. A pusher 216 which opposes the positioning roller 214 is provided at the other longitudinal end. In the pusher 216, a pushing roller 220 is provided on a driving block 218A of a rodless cylinder 218. Due to the driving of the rodless cylinder 218, the pushing roller 220 pushes a longitudinal direction end surface of the printing plate 20A toward the positioning roller 214. In this way, the printing plate 20A is positioned on the plate bending stand 206. A plurality of suction grooves 222 is formed on the upper surface of the plate bending stand 206. After the positioning of the printing plate 20A has been completed, negative pressure is supplied to the suction grooves 222 from an unillustrated negative pressure means so that the printing plate 20A is sucked and held to the plate bending stand 206.

Plate benders 224, 226 are disposed at positions corresponding to the respective longitudinal direction end portions of the printing plate 20A positioned on the plate bending stand 206. The plate benders 224, 226 push the respective longitudinal direction end portions of the printing plate 20A downward (toward the rear of FIG. 7) and bend the printing plate 20A so that the printing plate 20A can be wound around a plate cylinder of a rotary press.

When the printing plate 20A is discharged from the plate bending stand 206, the positioning rollers 210 are accommodated in the through-holes 212, and the supply of negative pressure to the suction grooves 222 is canceled. Accordingly, the holding of the printing plate 20A on the plate bending stand 206 is canceled. In this state, the printing plate 20A is conveyed and sent from the plate bending section 36 by the conveying belts 208 being rotated.

Plate detecting sensors 228, 230 are disposed in the plate bending section 36 along the conveying direction of the printing plate 20 at the punching section 34 side and the side opposite thereto. The plate detecting sensor 228 senses that the printing plate 20 has been sent into the plate bending section 36, and the plate detecting sensor 230 senses that the printing plate 20 has been sent from the plate bending section 36.

The printing plates 20 sent from the plate bending section 36 are stored at an outer side of the end portion of the discharge side of the plate bending section 36.

Next, the operation of the present embodiment will be described.

The upper surface of the printing plate 20 (the surface on which images are not exposed) is sucked and held by the sucking/raising device 102, and the printing plate 20 is raised from the printing plate holding stand 38 and transferred to the reversing device 104. One transverse end portion of the printing plate 20 is sucked and held by the reversing device 104, and the printing plate 20 is rotated thereby. In this way, the printing plate 20 is reversed such that the image recording surface thereof faces upward.

The printing plate 20 is loaded onto the lift stand 300 with the image recording surface of the printing plate 20 facing upward. After positioning of the printing plate 20 on the lift stand 300 has been effected, the printing plate 20 is transferred to the horizontally conveying device 106 where the bottom surface of the printing plate 20 is supported by a plurality of claw portions. The printing plate 20 is then conveyed to a position above the surface plate 408 of the drawing section 18.

The printing plate 20 loaded on the surface plate 408 of the drawing section 18 is charged. Thereafter, an electrostatic latent image is formed on the image recording surface of the printing plate 20 by the drawing device. The printing plate 20 is loaded onto the insertion stages 532 of the plate discharging section 14 by the removing device 450 and the conveying stage 502, and is sent to the developing section 22. In the developing section 22, the printing plate 20 on which an electrostatic latent image has been formed undergoes developing processing. After the developed printing plate 20 undergoes fixing processing, the printing plate 20 is sent to the eluting section 28.

In the eluting section 28, the printing plate 20 is submerged in an alkali solution. Portions of the OPC layer to which the toner does not adhere are eluted. Thereafter, a gum solution is applied to the printing plate 20 in order to protect the surface thereof. After the surface of the plate has been protected, the printing plate 20 is sent to the drying section 30 where it is dried. The dried printing plate 20 is sent from the drying section 30 to the standby section 32. The printing plate 20 is conveyed along the longitudinal direction thereof from the plate discharging section 14 to the standby section 32.

In the standby section 32, the conveying belts 142 are rotated so that the printing plate 20 sent in from the drying section 30 is conveyed by the conveying belts 142 along the longitudinal direction of the standby section 32. At this time, the plate detecting sensor 162 detects the leading end of the printing plate 20, and simultaneously, the plate detecting sensor 164 is operated. When the printing plate 20 is detected by the plate detecting sensor 164, it is determined that the printing plate 20 sent in from the drying section 30 is the printing plate 20A. The positioning rollers 148 are accommodated in the throughholes 146 due to the driving of the air cylinders 150, and the printing plate 20A is stopped at the positioning rollers 144.

The processing of the printing plate 20A of a size of two newspaper pages is described hereinafter.

In the standby section 32, when the plate detecting sensor 158 verifies that the printing plate 20A has been stopped by the positioning rollers 144, the rotation of the conveying belts 142 is stopped. The printing plate 20A is sent into the punching section 34 by the pusher 166. In the standby section 32, the printing plate 20A is stopped by the positioning rollers 144 and is positioned with respect to the punching section 34.

When the printing plate 20A is sent into the punching section 34, the conveying belts 184 of the punching stand 182 are rotated so as to convey the printing plate 20A. The printing plate 20A abuts the positioning rollers 186 and stops. Thereafter, the printing plate 20A is made to abut the positioning roller 190 by the pusher 192. The printing plate 20A is positioned on and sucked and held to the punching stand 182. Punch holes, which serve as references when the printing plate 20A is loaded at the cylinder of a rotary press, are formed by the punchers 202, 204 in the printing plate 20A positioned on and held at the punching stand 182.

The printing plate 20A in which punch holes have been formed is sent to the plate bending section 36. In the plate bending section 36, transverse direction positioning of the printing plate 20A is effected by the positioning rollers 210, and longitudinal direction positioning of the printing plate 20A is effected by the pusher 216 and the positioning roller 214. When the printing plate 20A is positioned on the plate bending stand 206, negative pressure is supplied to the suction grooves 222 so that the printing plate 20A is sucked and held to the plate bending stand 206. Both longitudinal end portions of the printing plate 20A are formed into bent portions for loading the printing plate 20A at a cylinder of a rotary press. The bent printing plate 20A is discharged from the plate bending section 36.

Next, the processing of the printing plate 20B of a size of one newspaper page will be described.

In the standby section 32, when the plate detecting sensor 162 detects the leading end of the printing plate 20 and the plate detecting sensor 164 does not detect the printing plate 20, it is determined that the printing plate 20B has been sent into the standby section 32. The positioning rollers 148 are projected by the air cylinders 150, and the printing plate 20B is stopped. When the plate detecting sensor 160 verifies that the printing plate 20B has been stopped, the rotation of the conveying belts 142 is stopped. The printing plate 20B is then sent into the punching section 34 by the pusher 166.

The printing plate 20B sent into the punching section 34 is conveyed by the conveying belts 184. At this time, the interval between the positioning rollers 186 is longer than the longitudinal direction dimension of the printing plate 20B. Further, because the printing plate 20B is positioned in the standby section 32 with respect to the punching stand 182, the printing plate 20B passes through the space between the positioning rollers 186 and is sent to the plate bending section 36.

In the plate bending section 36, the interval between the positioning rollers 210 of the plate bending stand 206 is longer than the printing plate 20B. Therefore, the printing plate 20B passes through the space between the positioning rollers 210 and is discharged from the plate bending section 36.

In this way, when the printing plate 20A of a size of two newspaper pages is processed in the direct plate making apparatus 10, after one end of the printing plate 20A has been positioned in the standby section 32, the conveying direction is changed. The printing plate 20A is then conveyed successively to the punching section 34 and the plate bending section 36 where punching and bending processing are effected respectively.

Further, when the printing plate 20B of a size of one newspaper page is processed, positioning which enables the printing plate 20B to pass through the punching section 34 and the plate bending section 36 is effected at the standby section 32. Thereafter, the printing plate 20B passes through the punching section 34 and the plate bending section 36, and is discharged from the plate bending section 36. As a result, processing of the printing plate 20B can proceed smoothly without the printing plate 20B stopping in the punching section 34 and the plate bending section 36.

In the direct plate making apparatus 10, in the standby section 32 provided downstream of the developing section, the conveying direction of the printing plate 20 is changed from a direction along the longitudinal direction of the printing plate 20 to a direction along the transverse direction of the printing plate 20. As a result, the printing plate 20 is conveyed along the transverse direction thereof in the punching section 34 and the plate bending section 36. The mechanisms for effecting punching processing and plate bending processing of the printing plate 20 do not interfere with the conveying path of the printing plate 20.

In the present embodiment, the position at which the conveying direction of the printing plate 20 is changed is not limited. The printing plate 20 may be conveyed along the longitudinal direction thereof in the developing/fixing section 22, and may be conveyed along the transverse direction in the punching section 34 and the plate bending section 36. Further, the punching section 34 and the plate bending section 36 may be disposed so that the printing plate 20 is conveyed in the direction opposite to the conveying direction of the present embodiment (i.e., the printing plate 20 may be conveyed in the direction opposite to arrow E in the drawings).

In the standby section 32, the printing plate 20 is conveyed by the motion of the conveying belts 142 and is sent out of the standby section 32 by being slid on the conveying belts 142. There is an appropriate degree of friction between the respective surfaces of the conveying belts 142 and the supporting body of the printing plate 20. In this way, the printing plate 20 is conveyed by the conveying belts 142 without slipping thereon. Further, when the printing plate 20 is slid on the conveying belts 142, the printing plate 20 is not subjected to a large frictional force and consequently is not damaged.

Next, a second embodiment of the present invention will be described. The structure of the second embodiment is basically the same as that of the first embodiment. The same parts are designated by the same reference numerals, and description thereof is omitted.

A direct plate making apparatus 11 relating to the second embodiment of the present invention is illustrated in FIG. 8. In the direct plate making apparatus 11, a cooling section 27 located downstream of the fixing processing section 26 of a developing/fixing section 23 serves as a direction changing section. In the cooling section 27 (description thereof was omitted from the first embodiment), the printing plate 20 which is heated by the fixing lamp in the fixing processing section 26 is cooled to a predetermined temperature by, for example, being blown by cool air. The printing plate 20 is then sent to an eluting section 28A.

As shown in FIG. 8, the eluting section 28A, a drying section 30A, and a standby section 31 are formed continuously downstream of the fixing processing section 26 of the developing/fixing section 23, and are formed so that respective dimensions thereof in a direction orthogonal to the direction in which the printing plate 20 is conveyed are enlarged. The enlarged lengths of these sections provided downstream of the developing-/fixing section 23 are large enough for the printing plate 20A to be carried through these sections along the transverse direction of the printing plate 20A.

As illustrated in FIG. 9, a conveying table 250 is provided in the cooling section 27. A pair of conveying belts 252 is trained around the conveying table 250 from the upstream side to the downstream side. The pair of conveying belts 252 is connected to an unillustrated driving means. Due to driving force from the driving means, the portions of the conveying belts 252 on the upper surface side of the conveying table 250 are driven from the fixing processing section 26 side to the eluting section 28A side. As a result, the printing plate 20 sent from the fixing processing section 26 is sent by the driving of the conveying belts 252 to the eluting section 26A downstream. An intermediate portion of the conveying belt 252 in the transverse direction thereof is formed thickly such that the cross section of the conveying belt 252 is shaped as a mountain. The conveying belts 252 contact the rear surface of the printing plate 20 such that both end portions of the conveying belts 252 are lower than the surface of the conveying table 250.

The printing plate 20 is conveyed along the longitudinal direction thereof (the direction of arrow B) from the fixing processing section 26 onto the conveying table 250.

A turntable 254 is disposed in a central portion of the conveying table 250 between the pair of conveying belts 252. The turntable 254 is shaped as a perfect circle and is notched. The turntable 254 is disposed so as to be rotatable around the axial portion thereof. The upper surface of the turntable 254 is formed on substantially the same plane as the upper surface of the conveying table 250.

An air cylinder 256 is disposed beneath the conveying table 250. An end portion of a driving shaft 256A of the air cylinder 256 is pivotably connected to one end of a link 258. Another end of the link 258 is pivotably connected to the bottom surface of an outer circumferential portion of the turntable 254. The turntable 254 is rotated 90 degrees around its axial portion by the driving of the air cylinder 256.

Suction grooves 260 are arranged so as to form rectangular shapes on the upper surface of the turntable 254. Negative pressure is supplied to the suction grooves 260 from an unillustrated negative pressure supplying means. As a result, when the printing plate 20 stops on the upper surface of the turntable 254, negative pressure is supplied to the suction grooves 260, and the printing plate 20 is sucked and held to the turntable 254. When the turntable 254 is rotated with the printing plate 20 sucked and held thereon, the printing plate 20 also is rotated 90 degrees. When the printing plate 20 is sucked and held on the turntable 254, the printing plate 20 does not deviate from the position at which it was sucked to the turntable 254 even if the turntable 254 is rotated.

The pair of positioning rollers 144 is disposed between the pair of conveying belts 252 at the end portion at the eluting section 28A side. The positioning rollers 144 can rise above and sink below the upper surface of the conveying table 250. The positioning rollers 144 abut the leading end of the printing plate 20A sent from the fixing processing section 26 so as to stop the printing plate 20A on the conveying table 250.

The positioning rollers 148 are disposed between the turntable 254 and the positioning rollers 144. The positioning rollers 148 can rise above and sink below the upper surface of the conveying table 250. The positioning rollers 148 abut the leading end of the printing plate 20B sent from the fixing processing section 26 so as to stop the printing plate 20B on the conveying table 250.

The plate detecting sensors 158, 160 are provided in vicinities of the positioning rollers 144, 148 and detect whether respective printing plates 20A, 20B have been stopped on the conveying table 250. The longitudinal direction center of the printing plate 20A stopped by the positioning rollers 144 and the longitudinal direction center of the printing plate 20B stopped by the positioning rollers 148 substantially correspond to the axial center of the turntable 254.

A plate detecting sensor 262 is provided in a vicinity of the turntable 254 at the fixing processing section 26 side of the turntable 254. The plate detecting sensor 164 is provided in a vicinity of an end portion of the conveying table 250 at the fixing processing section 26 side of the conveying table 250. The plate detecting sensors 262, 164 detect whether the printing plate 20 sent from the fixing processing section 26 is the elongated printing plate 20A. When the printing plate 20A is detected, the positioning rollers 144 are protruded, and the positioning rollers 148 are accommodated beneath the conveying table 250. When the printing plate 20B is detected, the positioning rollers 148 are protruded.

The central portion of the printing plate 20 stopped on the upper surface of the conveying table 250 is sucked by the suction grooves 260 of the turntable 254 so as to be held by the turntable 254. In this state, the positioning rollers 144 (or 148) are accommodated, and the air cylinder 256 is driven so that the turntable 254 is rotated 90 degrees. In this way, one transverse direction end of the printing plate 20 faces the eluting section 28A. Thereafter, when the supply of negative pressure to the suction grooves 260 is canceled, the holding of the printing plate 20 on the turntable 254 is canceled. Subsequently, the printing plate 20 is moved toward the eluting section 28A (i.e., in the direction of arrow F) by the driving of the conveying belts 252.

A pair of discharging rollers 362 is disposed in a vicinity of the eluting section 28A. When the printing plate 20 is inserted between the discharging rollers 362, the conveying force therefrom is applied to the printing plate 20 so that the printing plate 20 is sent into the eluting section 28A.

As can be seen from FIG. 8, the printing plate 20 is conveyed along the transverse direction thereof to the eluting section 28A and the drying section 30A where eluting processing and drying are effected respectively. Further, the standby section 31 is disposed downstream of the drying section 30A. In the standby section 31, the timing of the printing plate 20 discharged from the drying section 30A is determined, and the printing plate 20 is sent to the punching section 34.

In the cooling section 27, the conveying direction of the printing plate 20 is changed to run along the transverse direction of the printing plate 20. At this time, the center of the printing plate 20 in the longitudinal direction thereof corresponds to the transverse direction center of the conveying path downstream of the cooling section 27. As a result, the printing plate 20B passes through the punching section 34 and the plate bending section 36 as it is, and the forming of the punch holes and plate bending can be effected for only the printing plate 20A.

In the direct plate making apparatus 11, the conveying path of the printing plate 20 is formed as a straight line from the developing processing section 24. In the cooling section 27, the conveying direction of the printing plate 20 is changed from the longitudinal direction thereof to the transverse direction thereof. In this way, the printing plate 20B can easily pass through the punching section 34 and the plate bending section 36, and the length of the entire apparatus can be shortened. Further, because the standby section 31, the punching section 34 and the plate bending section 36 are disposed along the conveying direction from the developing/fixing section 22, the widthwise dimension of the downstream side of the apparatus can be made smaller.

The first and second embodiments illustrate examples of the present invention and do not restrict in any way the direct plate making apparatus relating to the present invention. Further, although the first and second embodiments were described using the example of the direct plate making apparatus, the present invention is also applicable to a plate making apparatus used for manufacturing photosensitive lithographic printing plates such as PS plates and the like.

What is claimed is:

1. A plate making apparatus comprising:
   a processing section conveying an elongated, rectangular printing plate, on which an image has been exposed, along a longitudinal direction of said printing plate and effecting processing of said printing plate;
   a punching section provided downstream of said processing section and conveying said printing plate, which has been processed, along a transverse direction of said printing plate and forming punch holes in both longitudinal direction end portions of said printing plate;
   a plate bending section provided downstream of said punching section and conveying said printing plate, in which punch holes have been formed, along the transverse direction of said printing plate and effecting bending of both longitudinal direction end portions of said printing plate; and
   a direction changing section provided between said processing section and said punching section, and changing a conveying direction of said printing plate from the longitudinal direction of said printing plate to the transverse direction of said printing plate, and moving said printing plate to said punching section.

2. A plate making apparatus according to claim 1, wherein said direction changing section has a first conveying means, said first conveying means conveying said printing plate along the longitudinal direction of said printing plate and in a direction from upstream to downstream of said processing section.

3. A plate making apparatus according to claim 1, wherein said direction changing section has a second conveying means, said second conveying means provided in the transverse direction of said printing plate and at a side opposite to a punching section side of said printing plate and said second conveying means moving said printing plate to said punching section.

4. A plate making apparatus according to claim 1, wherein said direction changing section has a positioning means, said positioning means effecting longitudinal direction positioning of said printing plate conveyed to said direction changing section.

5. A plate making apparatus according to claim 2, wherein said direction changing section has a first conveying means control means, said first conveying means control means detecting said printing plate conveyed by said first conveying means, and controlling operation of said first conveying means.

6. A plate making apparatus according to claim 3, wherein said second conveying means has a pusher member and a pusher member driving means, said pusher member driving means moving said pusher member in the transverse direction of said printing plate so that said printing plate is conveyed from said direction changing section to said punching section by a transverse direction end portion of said printing plate being pushed by said pusher member.

7. A plate making apparatus according to claim 4, wherein said positioning means has printing plate size detecting members and projecting members provided downstream of said printing plate size detecting members, said printing plate size detecting members being provided in a row and spaced apart at predetermined intervals in the longitudinal direction of said printing plate, and when said printing plate is conveyed in said direction changing section, said printing plate size detecting members detect a size of said printing plate and project said projecting members in accordance with the size of said printing plate so that said printing plate abuts said projecting members.

8. A plate making apparatus according to claim 7, wherein among said projecting members, projecting members corresponding to a largest size printing plate are always projected.

9. A plate making apparatus according to claim 5, wherein said first conveying means control means has printing plate detecting members corresponding to a size of said printing plate, said first conveying means control means controlling operation of said first conveying means by said printing plate detecting members detecting a corresponding printing plate.

10. A plate making apparatus comprising:
    a processing section conveying an elongated, rectangular printing plate, on which an image has been exposed, and effecting processing of said printing plate;
    a punching section provided downstream of said processing section and conveying said printing plate, which has been processed, along a transverse direction of said printing plate and forming punch holes in both longitudinal direction end portions of said printing plate;
    a plate bending section provided downstream of said punching section and conveying said printing plate, in which punch holes have been formed, along the transverse direction of said printing plate and effecting bending of both longitudinal direction end portions of said printing plate; and
    a direction changing section provided in said processing section and changing a conveying direction of said printing plate from a longitudinal of said printing plate to the transverse direction of said printing plate.

11. A plate making apparatus according to claim 10, wherein said direction changing section has a first conveying means, said first conveying means conveying said printing plate along the longitudinal direction of said printing plate and in a direction from upstream to downstream of said processing section.

12. A plate making apparatus according to claim 10, wherein said direction changing section has a printing plate rotating means, said printing plate rotating means rotating said printing plate around a normal line of said printing plate so as to change the conveying direction of said printing plate from the longitudinal direction of said printing plate to the transverse direction of said printing plate.

13. A plate making apparatus according to claim 10, wherein said direction changing section has a positioning means, said positioning means effecting longitudinal direction positioning of said printing plate conveyed to said direction changing section.

14. A plate making apparatus according to claim 11, wherein said direction changing section has a first conveying means control means, said first conveying means control means detecting said printing plate conveyed by said first conveying means, and controlling operation of said first conveying means.

15. A plate making apparatus according to claim 12, wherein said printing plate rotating means has a turntable, a link member and a turntable driving means, said turntable being circular and provided so as to be rotatable around an axial portion thereof, one end of said link member being rotatably connected to a vicinity of an outer circumference of said turntable and another end of said link member being rotatably connected to said turntable driving means so that said printing plate is rotated by driving of said turntable driving means.

16. A plate making apparatus according to claim 15, wherein said printing plate rotating means has a printing plate suction means, said printing plate suction means being provided at said turntable and sucking said printing plate so that a rotation of said printing plate is substantially identical to a rotation of said turntable.

17. A plate making apparatus according to claim 16, wherein said printing plate suction means has suction grooves arranged to form rectangular shapes as seen from above said printing plate suction means and has a negative pressure supplying means, said suction grooves sucking said printing plate by negative pressure being supplied to said suction grooves from said negative pressure supplying means.

18. A plate making apparatus according to claim 13, wherein said positioning means has printing plate size detecting members and projecting members provided downstream of said printing plate size detecting members, said printing plate size detecting members being provided in a row and spaced apart at predetermined intervals in the longitudinal direction of said printing plate, and when said printing plate is conveyed in said direction changing section, said printing plate size detecting members detect a size of said printing plate and project said projecting members in accordance with the size of said printing plate so that said printing plate abuts said projecting members.

19. A plate making apparatus according to claim 18, wherein among said projecting members, projecting members corresponding to a largest size printing plate are always projected.

20. A plate making apparatus according to claim 14, wherein said first conveying means control means has printing plate detecting members corresponding to a size of said printing plate, said first conveying means control means controlling operation of said first conveying means by said printing plate detecting members detecting a corresponding printing plate.

* * * * *